(12) United States Patent
Choi et al.

(10) Patent No.: US 6,300,184 B1
(45) Date of Patent: Oct. 9, 2001

(54) METHOD OF MANUFACTURING A CMOS TRANSISTOR

(75) Inventors: Jun Gi Choi; Seon Soon Kim, both of Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/609,158

(22) Filed: Jun. 30, 2000

(30) Foreign Application Priority Data

Jun. 30, 1999 (KR) .................................................. 99-25757

(51) Int. Cl.$^7$ ................................................ H01L 21/8238
(52) U.S. Cl. ......................... 438/233; 438/199; 438/218; 438/230; 438/231; 437/34; 437/54
(58) Field of Search ..................................... 438/233, 199, 438/218, 230, 231; 437/34, 57

(56) References Cited

U.S. PATENT DOCUMENTS

| | | | |
|---|---|---|---|
| 5,172,200 | 12/1992 | Muragishi et al. | 257/315 |
| 5,254,487 | * 10/1993 | Tamagawa | 437/34 |
| 5,286,665 | 2/1994 | Muragishi et al. | 437/44 |
| 5,349,228 | 9/1994 | Neudeck et al. | 257/365 |
| 5,670,397 | * 9/1997 | Chang et al. | 437/34 |
| 5,714,786 | 2/1998 | Gonzalez et al. | 257/366 |
| 5,726,071 | * 3/1998 | Segawa et al. | 437/57 |
| 5,902,121 | * 5/1999 | Goto | 438/199 |
| 6,005,273 | 12/1999 | Gonzalez et al. | 257/366 |

\* cited by examiner

Primary Examiner—Vu A. Le
Assistant Examiner—Pho Luu
(74) Attorney, Agent, or Firm—Pennie & Edmonds LLP

(57) ABSTRACT

There is disclosed a method of manufacturing a CMOS transistor, by which ion implantation process is selectively performed to the gate formed region of a polysilicon film after a NMOS transistor region and a PMOS transistor region are defined in the process of manufacturing a CMOS transistor. Thus, it can obtain a reliable device by solving the problem occurring when polysilicon films doped with different impurities are simultaneously etched and the problem that a tungsten film is oxidized due to a selective oxidization process after forming a tungsten gate electrode.

18 Claims, 3 Drawing Sheets

METHOD OF MANUFACTURING A CMOS TRANSISTOR

BACKGROUND OF THE INVENTION

1. Field of the Invention

The invention relates generally to a method of manufacturing a dual gate CMOS transistor of a semiconductor device. More particularly, the present invention relates to a method of manufacturing a CMOS transistor by which ion implantation process is selectively performed to the gate formed region of a polysilicon film after a NMOS transistor region and a PMOS transistor region are defined in the process of manufacturing a CMOS transistor, thus it can obtain a reliable device by solving the problem occurring when polysilicon films doped with different impurities are simultaneously etched and the problem that a tungsten film is oxidized due to a selective oxidization process after forming a tungsten gate electrode.

1. Description of the Prior Art

Referring now to FIGS. 1A through 1C, a method of manufacturing a conventional CMOS transistor will be explained below.

First, referring to FIG. 1A, a trench is formed at a given region on a semiconductor device 101. Then, a device separation film 102 is formed by oxidization process to separate a p-well region and an n-well region. Then, a NMOS transistor region and a PMOS transistor region are defined by means of ion implantation process using an ion implantation mask. Next, a gate oxide film 103 and a polysilicon film 104 are formed on the entire structure. By performing twice application process of a photosensitive film and patterning process, n-type impurity is implanted into the polysilicon film 104 of the NMOS transistor region and p-type impurity is implanted into the polysilicon film 104 of the PMOS transistor region, thus forming a dual polysilicon film.

As shown in FIG. 1B, after the photosensitive film pattern 105 is removed, a barrier metal layer 106, a metal layer 107 and a nitride film 108 are sequentially formed on the entire structure. Tungsten is usually used as the metal layer 107.

Referring now to FIG. 1C, selected regions of the nitride film 108, the metal layer 107, the barrier metal layer 106 and the polysilicon film 104 are etched to form a gate electrode. Then, a oxide film 109 is formed from the side wall of the polysilicon film 104 to the upper portion of the semiconductor substrate 101 by means of a selective oxidization process, so that the tungsten film used as the metal layer 107 is not oxidized. Next, after low concentration impurity ion implantation process, a conventional method of manufacturing a CMOS is performed.

However, in the conventional CMOS manufacturing process as explained above, the gate forming method has a problem of an abnormal oxidization phenomenon in which the metal layer (tungsten film) is expanded due to a subsequent process. This causes a problem that after forming a gate electrode, ions are not implanted into the edge of the gate electrode by the expanded portion of the gate electrode due to abnormal oxidization, in the a low concentration impurity ion implantation process being a subsequent process.

Also, in the conventional dual gate process, upon etching of the polysilicon film for forming the gate electrode, as impurities implanted into the polysilicon film of the NMOS transistor region and the PMOS transistor region are different each other, the etching rate are thus different. Accordingly, it causes a problem that the semiconductor substrate will be damaged, etc. Further, in order to prevent oxidization of tungsten used as the gate electrode, it has to use very expensive equipment only for use in selective oxidization process.

SUMMARY OF THE INVENTION

It is therefore an object of the present invention to provide a method of manufacturing a CMOS transistor of a semiconductor device by which reliability of a device can be improved by applying a semi damascene structure capable of implementing LDD oxidization, without the problem of different etching characteristics of the n-type polysilicon film and the p-type polysilicon film occurring in the process of etching the ploysilicon film upon formation of the dual gate electrode, and implementation of selective oxidization process.

A method of manufacturing a CMOS transistor according to the present invention is characterized in that it comprises the step of forming a device separation film a given region on a semiconductor substrate to define a PMOS transistor region and a NMOS transistor region; sequentially forming a gate oxide film, a polysilicon film and an oxide film and then removing said oxide on which gate will be formed to expose a given region of said polysilicon film; implanting different impurity ions into the polysilicon film of said exposed NMOS transistor and PMOS transistor; forming a spacer at the side wall of the etched oxide film on the portion in which said gate will be formed and then forming a tungsten nitride film on the entire structure; forming a tungsten film on the entire structure so that the portion in which said gate will be formed can be buried, and then remains a given portion of the portion in which said gate will be formed by blanket etching process; forming an insulating film on the entire structure and then remaining a nitride film on said tungsten film of the portion in which said gate will be formed by polishing process; removing said oxide film to remain a tungsten film, a nitride film and a spacer surrounding them, and then using them as a mask to etch said polysilicon film and said gate oxide film into which impurity are not implanted, thus forming a dual structure; forming an oxide film from said polysilicon film to on the underlying semiconductor substrate by means of selective oxidization process; and performing low concentration impurity ion implantation process and high concentration impurity ion implantation process after forming a spacer at the side wall of the gate to form a junction region.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
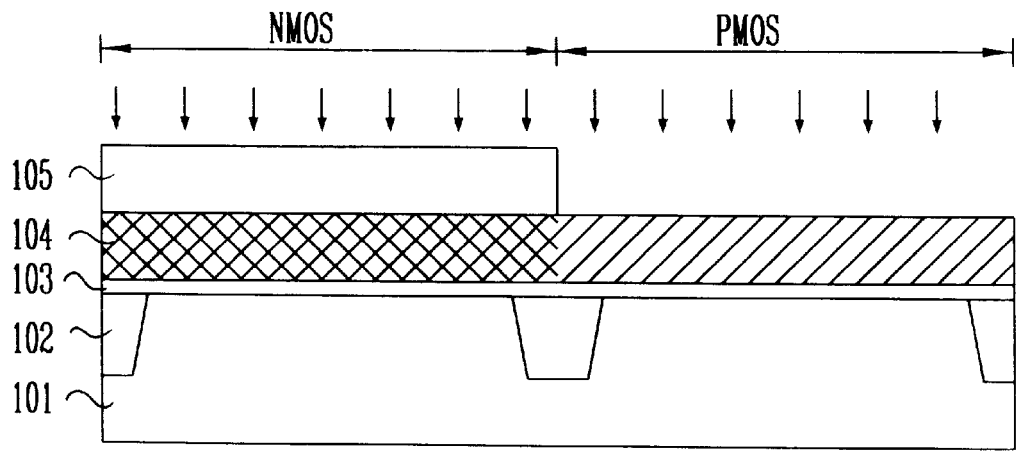
FIGS. 1A through 1C are sectional views of devices for sequentially illustrating a method of manufacturing a conventional CMOS transistor.
Figure 1B:
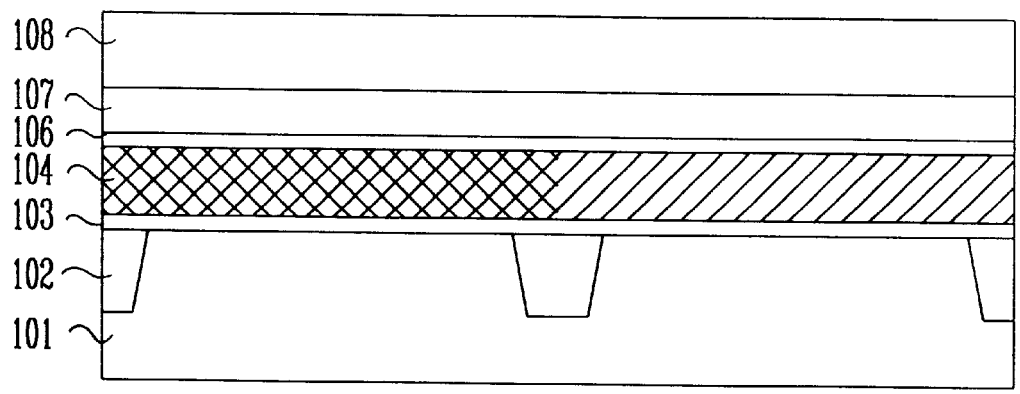
Figure 1C:
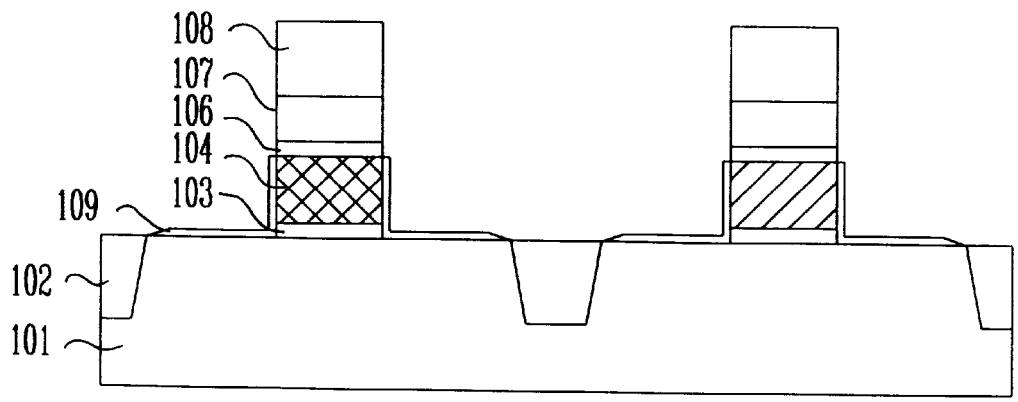

The present invention will be described in detail by way of a preferred embodiment with reference to accompanying drawings, in which like reference numerals are used to identify the same or similar parts.

FIGS. 2A through 2D are sectional views of devices for sequentially illustrating a method of manufacturing a CMOS transistor according to the present invention.

Figure 2A:
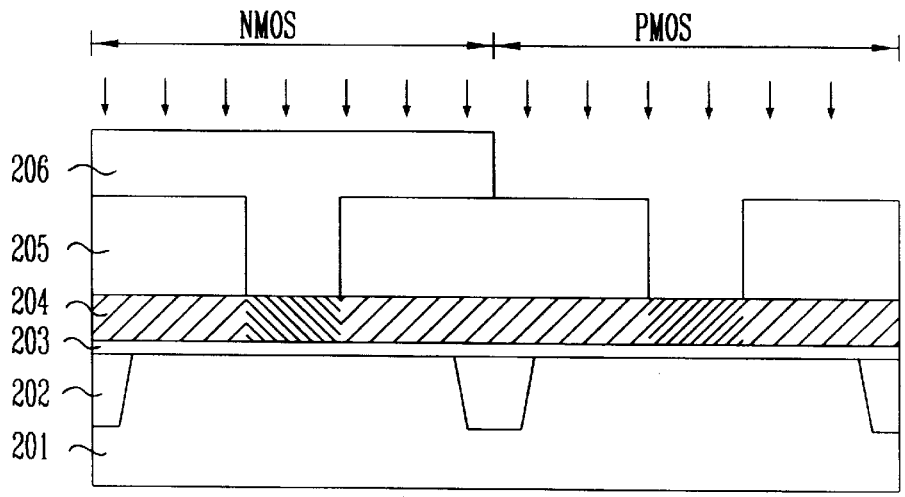
FIGS. 2A through 2D are sectional views of devices for sequentially illustrating a method of manufacturing a CMOS transistor according to the present invention.

Referring now to FIG. 2A, a trench is formed at a given region on a semiconductor device 201. Then, a device separation film 202 is formed by oxidization process to define a PMOS transistor region and a NMOS transistor region. Then, a gate oxide film 203, a polysilicon film 204 and a first oxide film 205 are sequentially formed on the entire structure. Next, a portion of the first oxide film 205 in which a gate will be formed is etched to expose a given region of the polysilicon film 204. By performing twice application process of a photosensitive film and ion implantation process, n-type impurity is implanted into the polysilicon film 204 of the exposed NMOS transistor region and p-type impurity is implanted into the polysilicon film 204 of the PMOS transistor region, thus forming a dual polysilicon film.

Figure 2B:
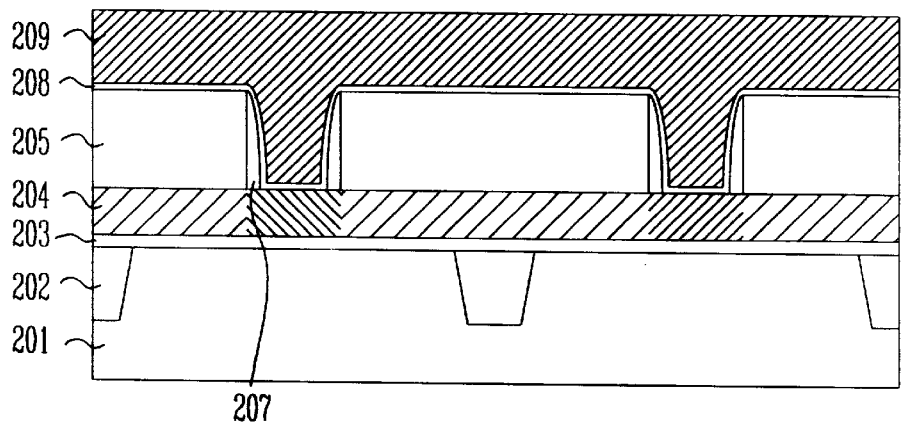

Referring to FIG. 2B, the photosensitive pattern 206 is removed. Then, after an oxide film, a nitride film or an oxy-nitride film is formed on the entire structure, a spacer 207 is formed at the side wall of the first oxide films 205 by blanket etching process. Next, after a tungsten nitride film (WN) 208 is formed on the entire structure, a tungsten film 209 is formed on the entire structure so that between the first oxide films 205 can be completely buried.

Figure 2C:
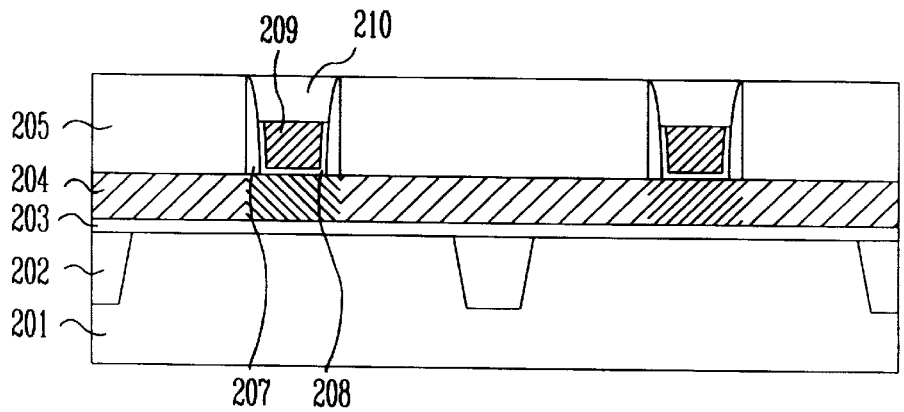

Referring now to FIG. 2C, the tungsten film 209 is blanket-etched to remain it at a given portion in which the gate will be formed. An insulating film 210 made of an oxide film, a nitride film or an oxy-nitride film is formed on the entire structure including the region in which the gate will be formed. Then, CMP process is performed using the oxide film 205 as a barrier.

Figure 2D:
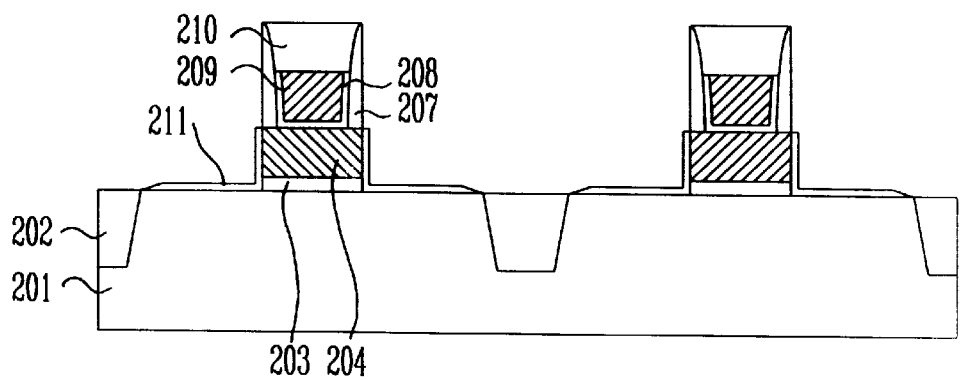

Finally, referring to FIG. 2D, the first oxide film 205 is removed to remain the tungsten film 209 and the insulating film 210, and the spacer 207 surrounding them. Then, the polysilicon film 204 into which impurity are not implanted and the oxide film 203 are etched using the remaining structure as a mask to form a dual structure. Next, a second oxide film 211 is formed from the polysilicon film 204 to on the underlying semiconductor substrate 201 by means of thermal oxidization process. Finally, a conventional process completes the process of manufacturing a CMOS transistor.

As can be understood from the above description, according to the present invention, in the process of manufacturing a semiconductor memory device having more than Giga byte, as the polysilicon to be etched using a semi damascene structure is a ploysilicon film into which ions are not implanted, it is made possible to make the etching rate of the ploysilicon film uniform. Also, using a semi damascene structure, it is possible to overcome the problem that selective oxidization process has to be formed after the tungsten electrode is formed. Thus, it can reduce the cost to purchase the equipment necessary for selective oxidization process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a CMOS transistor, comprising the steps of:

forming a device separation film a given region on a semiconductor substrate to define a PMOS transistor region and a NMOS transistor region;

sequentially forming a gate oxide film, a polysilicon film and an oxide film and then removing said oxide on which gate will be formed to expose a given region of said polysilicon film;

implanting different impurity ions into the polysilicon film of said exposed NMOS transistor and PMOS transistor;

forming a spacer at the side wall of the etched oxide film on the portion in which said gate will be formed and then forming a tungsten nitride film on the entire structure;

forming a tungsten film on the entire structure so that the portion in which said gate will be formed can be buried, and then remaining a given portion of the portion in which said gate will be formed by blanket etching process;

forming an insulating film on the entire structure and then remaining a nitride film on said tungsten film of the portion in which said gate will be formed by polishing process;

removing said oxide film to remain a tungsten film, a nitride film and a spacer surrounding them, and then using them as a mask to etch said polysilicon film and said gate oxide film into which impurity are not implanted, thus forming a dual structure;

forming an oxide film from said polysilicon film to on the underlying semiconductor substrate by means of selective oxidization process; and performing low concentration impurity ion implantation process and high concentration impurity ion implantation process after forming a spacer at the side wall of the gate to form a junction region.

2. The method of manufacturing a CMOS transistor according to claim 1, wherein said spacer formed at the side wall of said oxide film is any one of an oxide film, a nitride film and a oxy-nitride film.

3. The method of manufacturing a CMOS transistor according to claim 1, wherein said insulating film is any one of an oxide film, a nitride film and a oxy-nitride film.

4. A method of manufacturing a CMOS transistor, comprising the steps of:

providing a semiconductor substrate;

forming a device separation film in said semiconductor substrate to thereby define a first region and a second region;

sequentially forming a gate oxide film, a polysilicon film and a first oxide film above the semiconductor substrate;

forming a first opening in the first oxide film in the first region to thereby expose a first area of the polysilicon film, and a second opening in the first oxide film in the second region to thereby expose a second area of the polysilicon film;

implanting N-type impurity ions in the first area of the polysilicon film and implanting P-type impurity ions in the second area of the polysilicon film;

forming a first spacer on sidewalls of the first opening and a second spacer on sidewalls of the second opening;

forming a tungsten nitride film, the tungsten nitride film at least partially entering the first and second openings;

forming a tungsten film on top of the tungsten nitride film, the tungsten film at least partially entering the first and second openings;

forming an insulating film on top of the tungsten film, the insulating film at least partially entering the first and second openings;

removing at least some of the first oxide film while leaving the spacers surrounding the tungsten film and the insulating film;

etching the polysilicon film and the gate oxide film outside the first and second areas to thereby form a first gate structure and a second gate structure; and forming a second oxide film on outer walls of the first and second gate structure.

5. The method according to claim 4, wherein:

the first and second openings are formed at the same time;

the N-type and P-type impurities are implanted at different times;

the first and second spacers are formed at the same time;

the tungsten nitride film is formed in the first and second openings at the same time;

the tungsten film is formed in the first and second openings at the same time; and the insulating film is formed in the first and second openings at the same time.

6. The method according to claim 4, wherein the tungsten nitride film is deposited in the first and second openings and also over the first oxide film.

7. The method according to claim 6, wherein the tungsten film is deposited on top of the tungsten nitride film both in the first and second openings and also over the first oxide film.

8. The method according to claim 7, wherein the tungsten film is blanket-etched prior to the step of forming an insulating film on top of the tungsten film.

9. The method according to claim 8, wherein the insulating film is deposited on top of the tungsten film both in the first and second openings and also over the first oxide film.

10. The method according to claim 9, further comprising the step of performing a polishing process to remove at least portions of the insulating film, the polishing process using the first oxide film as a barrier.

11. The method according to claim 10, further comprising the step of performing a low concentration impurity ion process and a high concentration impurity ion implantation process on the substrate to form a junction region.

12. The method according to claim 4, wherein the second oxide film is formed around the polysilcon into which the N-type and P-type impurities were implanted.

13. The method according to claim 12, wherein the second oxide film is also formed over portions of the substrate.

14. The method according to claim 4, wherein said spacer formed on side walls of the first oxide film is any one of an oxide film, a nitride film and a oxy-nitride film.

15. The method according to claim 4, wherein said insulating film is any one of an oxide film, a nitride film and a oxy-nitride film.

16. A method of manufacturing a CMOS transistor, comprising the steps of:

forming a device separation film on a first region in a semiconductor substrate to define a future PMOS transistor region and a future NMOS transistor region;

sequentially forming a gate oxide film, a polysilicon film and a first oxide film and then forming a first opening in the PMOS transistor region and a second opening in the NMOS transistor region to thereby expose first and second portions of said polysilicon film from which a gate will be formed;

implanting N-type and P-type impurity ions into the exposed first and second portions of said polysilicon film, wherein N-type impurity ions are implanted to the region in which an NMOS transistor will be formed and P-type impurity ions are implanted to the region in which a PMOS transistor will be formed;

forming first and second spacers on side walls of the first and second openings, and then forming a tungsten nitride film on the entire structure;

forming a tungsten film on the tungsten nitride film so that portions where said gate will be formed can be buried;

blanket etching to remove said tungsten film except for portions where said gate will be formed;

forming an insulating film on the entire structure and then removing, by a polishing process, said insulating film except for portions present on said tungsten film where said gate will be formed;

removing said first oxide film to leave first and second structures comprising the first and second spacers surrounding the insulating film on top of the tungsten film with polysilicon film and gate oxide film into which impurities had not been implanted still covering the substrate, and then using the first and second structures as masks to etch the polysilicon film and the gate oxide film into which impurities had not been implanted, thereby forming a dual gate structure;

forming a second oxide film on side walls of the etched polysilicon film and on the exposed semiconductor substrate; and performing a low concentration impurity ion implantation process and a high concentration impurity ion implantation process to form a junction region.

17. The method of manufacturing a CMOS transistor according to claim 16, wherein said spacer formed on side walls of the first oxide film is any one of an oxide film, a nitride film and a oxy-nitride film.

18. The method of manufacturing a CMOS transistor according to claim 16, wherein said insulating film is any one of an oxide film, a nitride film and a oxy-nitride film.

* * * * *